(12) United States Patent
Al-Homoudi et al.

(10) Patent No.: US 7,994,602 B2
(45) Date of Patent: Aug. 9, 2011

(54) TITANIUM DIOXIDE THIN FILM SYSTEMS

(75) Inventors: Ibrahim Abdullah Al-Homoudi, Dearborn Heights, MI (US); Golam Newaz, Ann Arbor, MI (US); Gregory W. Auner, Livonia, MI (US)

(73) Assignee: Wayne State University, Detroit, MI (US)

( * ) Notice: Subject to any disclaimer, the term of this patent is extended or adjusted under 35 U.S.C. 154(b) by 0 days.

(21) Appl. No.: 12/612,978

(22) Filed: Nov. 5, 2009

(65) Prior Publication Data

US 2010/0043881 A1 Feb. 25, 2010

Related U.S. Application Data

(62) Division of application No. 11/757,060, filed on Jun. 1, 2007, now Pat. No. 7,632,761.

(60) Provisional application No. 60/810,084, filed on Jun. 1, 2006.

(51) Int. Cl.
*H01L 21/46* (2006.01)

(52) U.S. Cl. ............. 257/458; 257/3; 257/53; 257/295; 257/485; 136/246; 136/255; 136/257; 136/E23.115

(58) Field of Classification Search ................ 257/3, 53, 257/295, 458, 485; 136/244–246, 255–259
See application file for complete search history.

(56) References Cited

U.S. PATENT DOCUMENTS

| 6,420,742 B1 | 7/2002 | Ahn et al. .................... 257/295 |
| 7,378,356 B2 | 5/2008 | Zhang et al. .................. 438/778 |
| 2003/0056928 A1 | 3/2003 | Kubota et al. .................... 164/46 |
| 2006/0071592 A1 | 4/2006 | Narasimhan et al. ......... 313/506 |
| 2007/0082205 A1 | 4/2007 | Anzaki et al. ................. 428/432 |
| 2007/0148064 A1* | 6/2007 | Labrousse ..................... 422/211 |
| 2007/0259132 A1* | 11/2007 | Moser ........................... 427/576 |

OTHER PUBLICATIONS

Banfield, Jillian F., Veblen, David R., "Conversion of perovskite to anatase and $TiO_2$ (B): A TEM study and the use of fundamental building blocks for understanding relationships about the $TiO_2$ minerals", *American Minerologist*, vol. 77, pp. 545-557 (1992).

(Continued)

*Primary Examiner* — Dung A. Le
(74) *Attorney, Agent, or Firm* — Brinks Hofer Gilson & Lione

(57) ABSTRACT

A thin-film metal-oxide compound includes a titanium dioxide layer having a thickness of about 100 to 1000 nanometers. The titanium dioxide layer has a single-phase anatase structure. The titanium dioxide layer is directly disposed on a substrate comprised of glass, sapphire, or silicon. A solar cell includes a backing layer, a p-n junction layer, a metal-oxide layer, a top electrical layer and a contact layer. The backing layer includes a p-type semiconductor material. The p-n junction layer has a first side disposed on a front side of the backing layer. The metal-oxide layer includes an n-type titanium dioxide film having a thickness in the range of about 100 to about 1000 nanometers. The metal-oxide layer is disposed on a second side of the p-n junction layer. The top electrical layer is disposed on the metal-oxide layer, and the contact layer is disposed on a back side of the backing layer.

8 Claims, 18 Drawing Sheets

OTHER PUBLICATIONS

Bellows, Richard J., Marucchi-Soos, Elise P., Buckley, D. Terence, "Analysis of Reaction Kinetics for Carbon Monoxide and Carbon Dioxide on Polycrystalline Platinum Relative to Fuel Cell Operation", *Industrial and Engineering Chemistry Research*, vol. 35, pp. 1235-1242 (1996).

Carp, O.; Huisman, C.L.; Reller, A., "Photoinduced reactivity of titanium dioxide", *Progress in Solid State Chemistry*, vol. 32, pp. 33-177 (2004).

*Fuel Cell Handbook* (7th Ed.), EG&G Technical Services, Inc., U.S. Department of Energy, Morgantown, WV, (2004).

Hart, J.N.; Cervini, R.; Cheng, Y.-B.; Simon, G.P.; Spiccia, L., "Formation of anatase $TiO_2$ by microwave processing", *Solar Energy Materials & Solar Cells*, vol. 84, pp. 135-143 (2004).

Kay, H.F and Bailey, P.C., "Structure and Properties of $CaTiO_3$", *Acta Crystallographica*, vol. 10, pp. 219-226 (1957).

Latroche, M., Brohan, L., Marchand, R., and Tournoux, M., "New Hollandite Oxides: $TiO_2(H)$ and $K_{0.06}TiO_2$" *Journal of Solid State Chemistry*, pp. 78-82 (1989).

Simons, P.Y. and Dachille, F., The Structure of $TiO_2$ II, a high-pressure phase of $TiO_2$, *Acta Crystallographica*, vol. 23, pp. 334-336 (1967).

Tazawa, Masato; Okada, Masahisa; Kazuki, Yoshimura; Ikezawa, Shunjiro, "Photo-catalytic heat mirror with a thick titanium dioxide layer", *Solar Energy Material & Solar Cells*, vol. 84, pp. 159-170 (2004).

Toutoungi, Danielle; Hartick, Johannes, "The Carbon Monoxide Sensing Challenge", Cambridge Consultants, Cambridge, England, UK.

\* cited by examiner

TITANIUM DIOXIDE THIN FILM SYSTEMS

CROSS-REFERENCE TO RELATED APPLICATIONS

This application is a Divisional of U.S. Ser. No. 11/757,060, filed on Jun. 1, 2007, which application claims the benefit of U.S. Provisional Application Ser. No. 60/810,084 filed on Jun. 1, 2006, entitled "SYSTEM AND METHOD OF DEVELOPING ANATASE TITANIUM OXIDE FILMS," the entire contents of which are incorporated herein by reference.

BACKGROUND OF THE INVENTION

1. Field of the Invention

The present invention generally relates to a material having a thin film of titanium dioxide deposited on a substrate and a method of producing the same.

2. Description of Related Art

Semiconductor substrates commonly employ metal oxide films. In recent years, titanium dioxide ($TiO_2$) has become desirable because it is believed to have desirable characteristics. More specifically, $TiO_2$ has been believed to be desirable for a variety of reasons, including that it is a stable material, insoluble in water, attacked only by acids and alkalis, and is non-toxic.

Four natural polymorphs for $TiO_2$ are known: 1) anatase, 2) rutile, 3) brookite, and 4) $TiO_2$ (B). Anatase $TiO_2$ is has a single-phase, crystalline, tetragonal structure. Rutile also has a tetragonal structure, but comprises both an amorphous and a crystalline structure. Brookite has an orthorhombic structure, and $TiO_2$ (B) has a monoclinic structure.

A solar cell is a semiconductor that converts light photons into electricity. Solar cells are made by joining p-type and n-type semiconducting material. The positive and negative ions within the semiconductor provide the environment necessary for an electrical current to move through a solar cell. A solar cell photogenerates charge carriers (electrons and holes) in a light-absorbing material and separates the charge carriers. Preferably, a solar cell will separate the charge carriers to a conductive contact that will transmit the electricity.

Anatase $TiO_2$ is used as a semiconductor film in dye-sensitized solar cells. Typically, the anatase $TiO_2$ film is prepared by deposition from a colloid produced by a sol-gel method, resulting in a relatively thick film having a structure that is at least partially amorphous. In order to achieve crystallization, the film is subject to a hydrothermal treatment at 230° Celsius.

Semiconductor substrates employing metal oxide films have also been used in gas sensors. Gas sensors are typically fabricated as sintered porous pellets, or thick films, in which the resistance of the material depends largely on gas adsorption. Both n-type and p-type semiconductors may be used in gas sensors, but n-type are generally preferred because a resistance decrease with concentration is preferable over a resistance increase. In stoichiometric n-type oxides, carbon monoxide (CO) can inject electrons into the conduction band, which results in increasing the conductivity of the material; the CO interacts directly with the oxide rather than adsorbed oxygen.

Although titanium dioxide was thought to be desirable for the above applications, it is typically thicker than desired and methods of producing it have resulted in inconsistent densities. For example, the sol-gel method of deposition is known to create films having thicknesses in the range of 2 to 4 micrometers.

Additionally, titanium oxide films have typically contained contaminants, such as carbon. Furthermore, the films have typically been produced having a rutile phase, with an anatase phase being achieved only upon high temperature annealing, which may cause durability to be weakened. For example, use of chemical vapor deposition (CVD) results in the deposition of a rutile titanium dioxide film, which can be converted to anatase film by only by high temperature annealing. CVD also may result in poor adhesion of the film to the substrate.

In view of the above, there exists a need for a thin film titanium dioxide that is preferably in an anatase phase upon deposition, which is relatively thin and has good adhesion and durability properties.

BRIEF SUMMARY OF THE INVENTION

The present invention provides a thin film titanium dioxide that can be produced in an anatase phase upon deposition, and which has good adhesion and durability properties. The film has a thickness that is less than about 1000 nanometers. The thin film may be provided as a thin film titanium dioxide compound comprising a titanium dioxide layer having a thickness of about 100 to 1000 nanometers and a substrate on which the titanium dioxide layer is disposed.

In one example, the present invention provides a method of making a titanium dioxide thin film. In this example, the method includes introducing gaseous oxygen to a sputtering chamber comprising a titanium source and a substrate, performing a magnetron reactive sputtering process to vaporize at least portions of the titanium source to react the titanium source with oxygen, forming titanium dioxide, and depositing the titanium dioxide on the substrate to define the titanium dioxide thin film.

In another aspect of the present invention, the thin film titanium dioxide may be utilized as part of a solar cell for converting photons into electricity. The solar cell has a backing layer comprising a p-type semiconductor material, the backing layer having a front side and a back side, a p-n junction layer having a first side and a second side, the first side being disposed on the front side of the backing layer, a metal-oxide layer comprising an n-type titanium dioxide film, a top electrical layer disposed on the metal-oxide layer, and a contact layer disposed on the back side of the backing layer. The metal-oxide layer is disposed on the second side of the p-n junction layer and preferably has a thickness in the range of about 100 to about 1000 nanometers.

In another aspect, the thin film titanium dioxide may be used as part of an inventive carbon monoxide sensor for sensing gaseous carbon monoxide. The carbon monoxide sensor includes a substrate, an n-type titanium dioxide film disposed on the substrate, and at least one electrode disposed on the substrate for transmitting an electrical signal from the sensor. Preferably, the film has a thickness in the range of about 100 to about 1000 nanometers.

Further objects, features and advantages of this invention will become readily apparent to persons skilled in the art after a review of the following description, with reference to the drawings and claims that are appended to and form a part of this specification.

DETAILED DESCRIPTION OF THE INVENTION

The present invention generally provides a thin film titanium dioxide whose thickness is in the range of about 100 to about 1000 nanometers. In order to obtain this thin film titanium dioxide consistently, physical vapor deposition was used, which will be described in further detail below. The present invention also provides a solar cell and carbon monoxide sensor, utilizing the thin film titanium dioxide.

Figure 1:
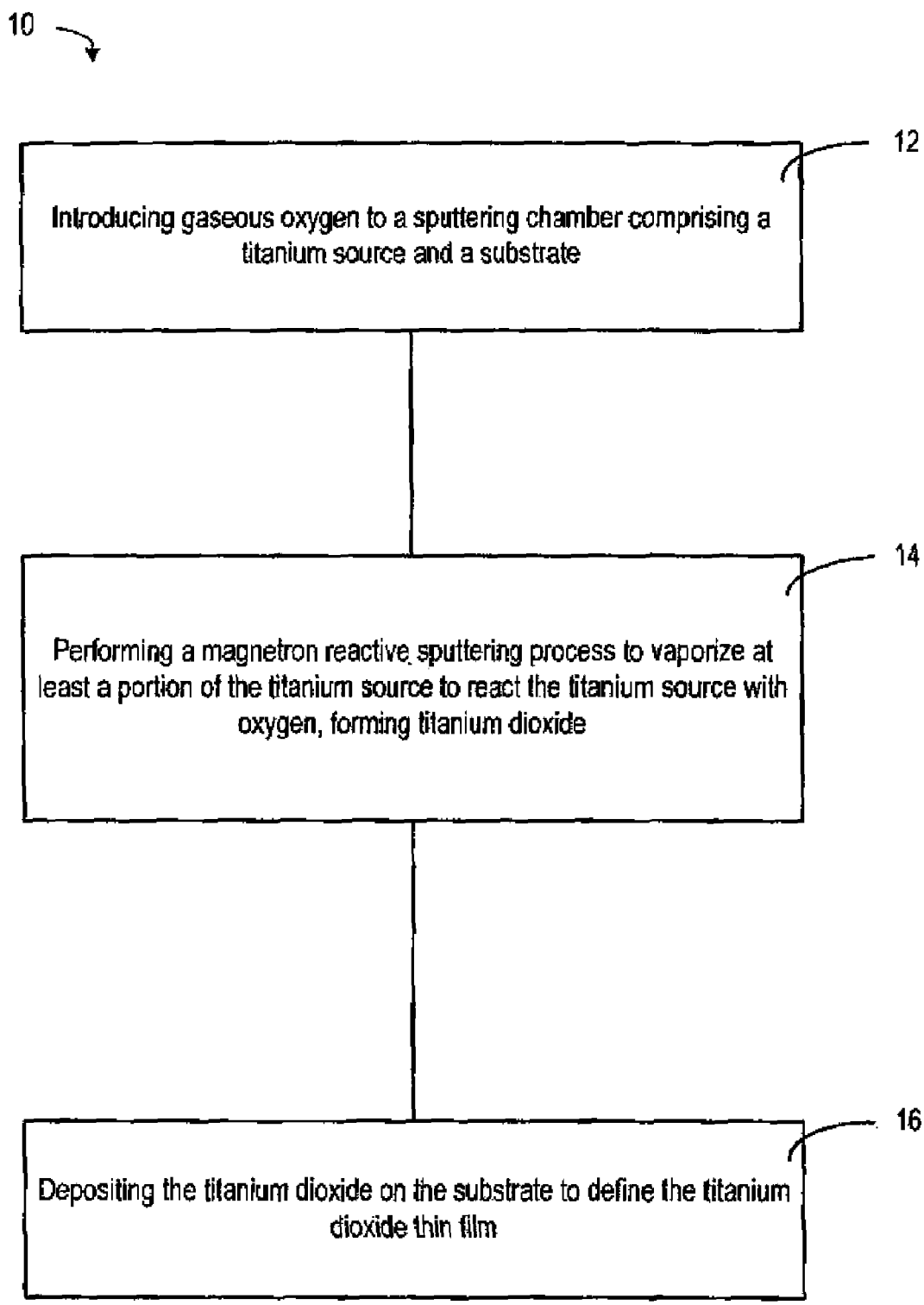
FIG. 1 is a block diagram illustrating a method embodying the principles of the present invention.

Referring now to FIG. 1, a method 10 of making a titanium dioxide thin film is disclosed. The method 10 includes a first step 12 of introducing gaseous oxygen to a sputtering chamber comprising a titanium source and a substrate. The method 10 further includes a second step 14 of performing a magnetron reactive sputtering process to vaporize at least portions of the titanium source to react the titanium source with oxygen, forming titanium dioxide. The method 10 further includes a third step 16 of depositing the titanium dioxide on the substrate to define the titanium dioxide thin film.

Figure 2:
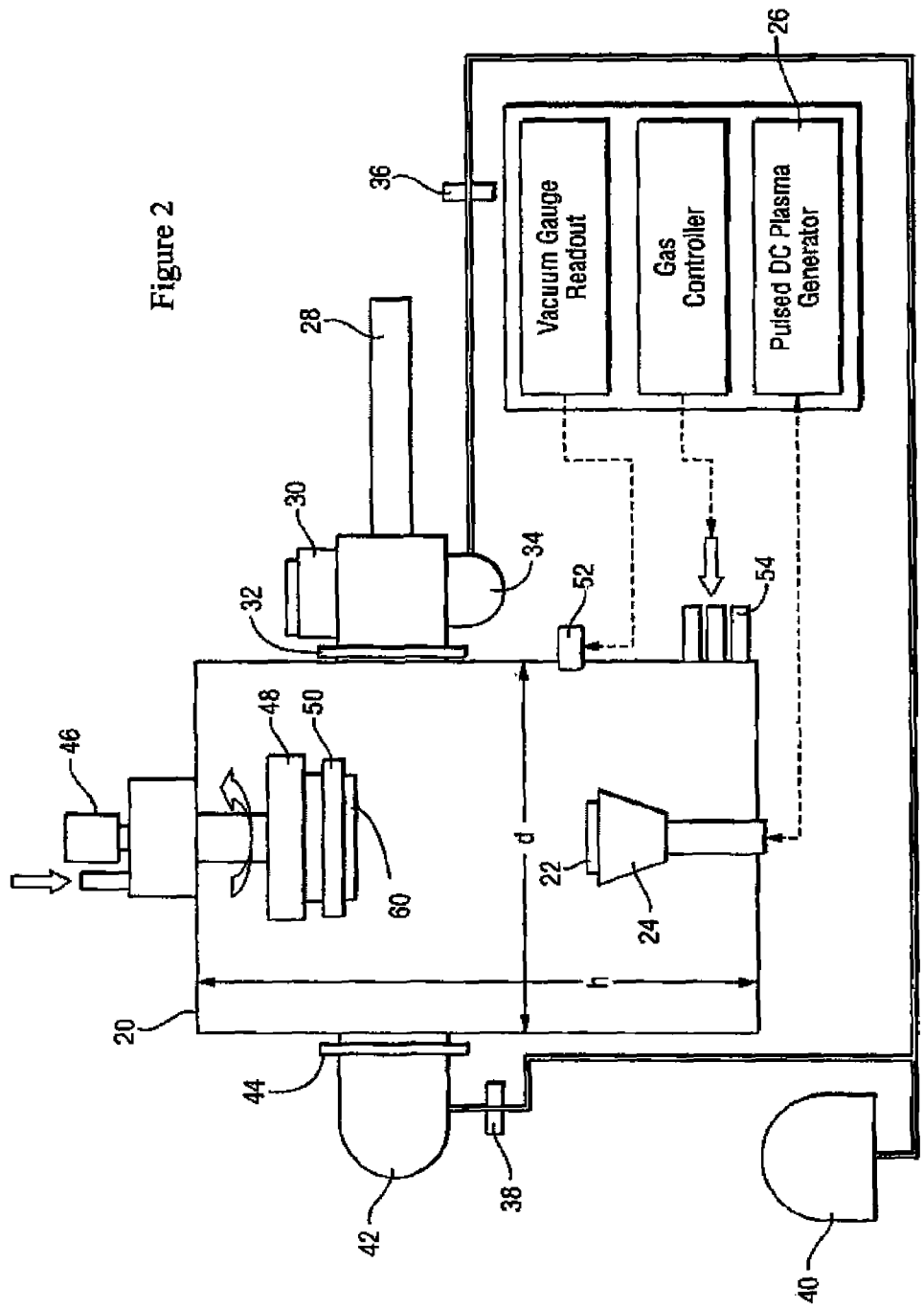
FIG. 2 is a sputtering chamber and associated components, which may be used to practice the method of FIG. 1.

Referring now to FIG. 2, a sputtering chamber 20 for performing the method 10 is disclosed. In this embodiment, the sputtering chamber 20 is preferably cylindrical with a height h and diameter d of about 550 mm each, although the sputtering chamber 20 could have other dimensions without falling beyond the spirit and scope of the present invention. Enclosed within the sputtering chamber 20 is a titanium source 22 disposed on a titanium holder 24 connected to a Pulsed DC Plasma Generator 26. The titanium source 22 is preferably loaded in the sputtering chamber 20 before changing the ambient conditions of the sputtering chamber 20.

As shown in the embodiment of FIG. 2, the sputtering chamber 20 has a loading arm 28 and a loading chamber 30, with a loading valve 32 and turbo pump 34. The turbo pump 34 is in fluid communication by valves 36, 38 to a mechanical pump 40 and a cryopump 42. The cryopump 42 is connected by valve 44 to the sputtering chamber 20. Other components associated with the sputtering chamber 20 include an electromechanical rotator 46 connected to a heater 48 and a substrate holder 50, an ion gauge 52, and gas intake tubes 54.

During the sputtering process 14, a substrate 60 is connected to the substrate holder 50. It is preferable to use a substrate 60 comprised of glass, silicon, or sapphire, however, other substrates may be appropriate for particular applications. In the preferred configuration, the substrate 60 is held at a distance of about 200 to 400 mm from the titanium source 22, and more preferably, at a distance of about 250 to 300 mm. Prior to loading the substrate 60 within the sputtering chamber 20, it is preferable to clean the substrate.

Figure 3:
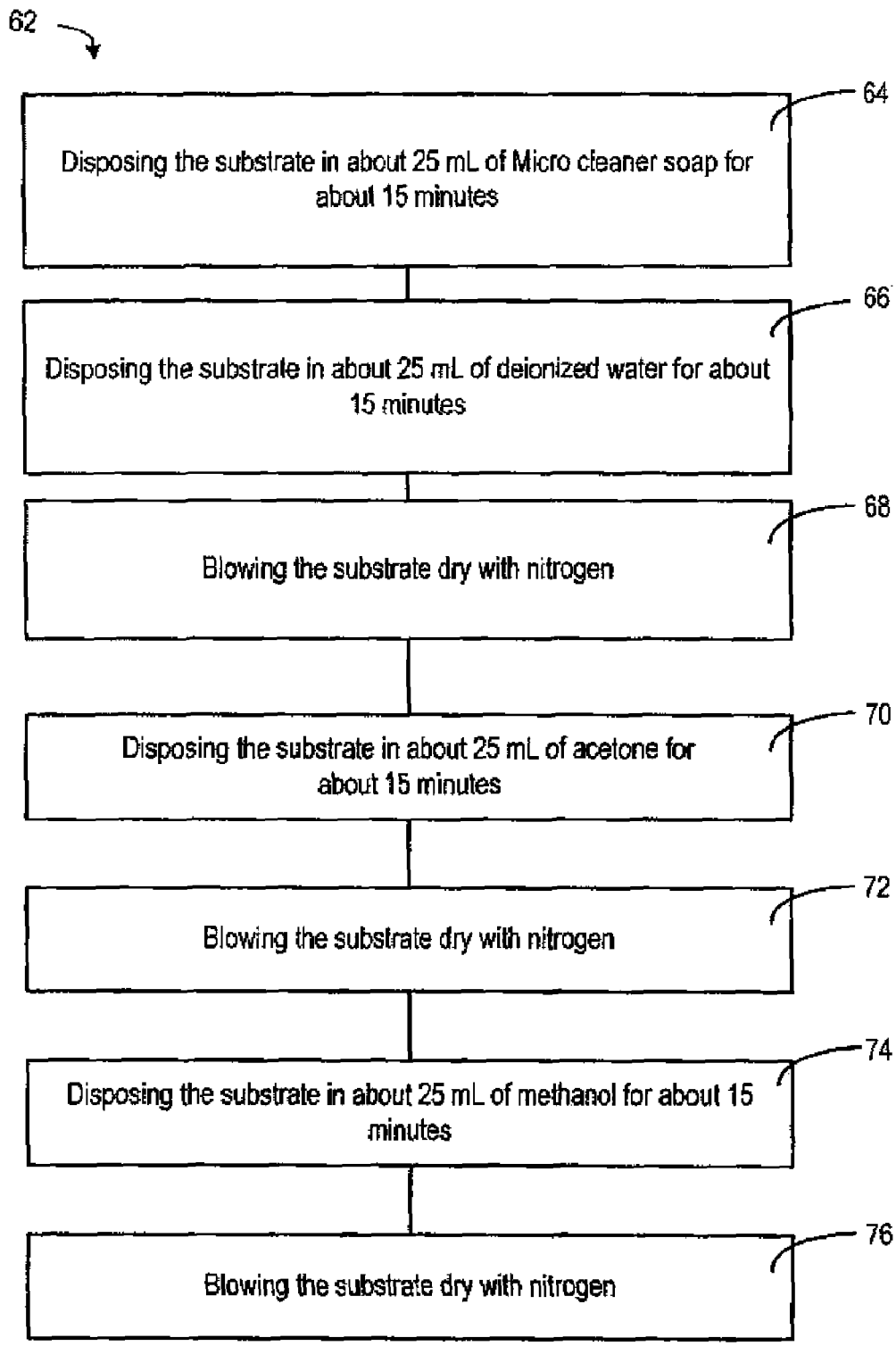
FIG. 3 is a block diagram illustrating a method of cleaning a glass substrate.

With reference to FIG. 3, a glass substrate 60 is preferably cleaned by giving the substrate 60 an ultrasonic bath. The glass ultrasonic bath procedure 62 should be performed under a fume hood. Preferably, the glass ultrasonic bath procedure 62 for a glass substrate 60 includes a first step 64 of disposing the substrate 60 in about 25 mL of Micro cleaner soap (90% deionized water and 10% soap) for about fifteen minutes. A second step 66 includes disposing the substrate 60 in about 25 mL of deionized water for about fifteen minutes. A third step 68 includes blowing the substrate 60 dry with nitrogen. A fourth step 70 includes disposing the substrate 60 in about 25 mL of acetone for fifteen minutes. A fifth step 72 includes blowing the substrate 60 dry with nitrogen. A sixth step 74 includes disposing the substrate 60 in about 25 mL of methanol for about fifteen minutes. A final step 76 includes blowing the substrate 60 dry with nitrogen.

Figure 4:
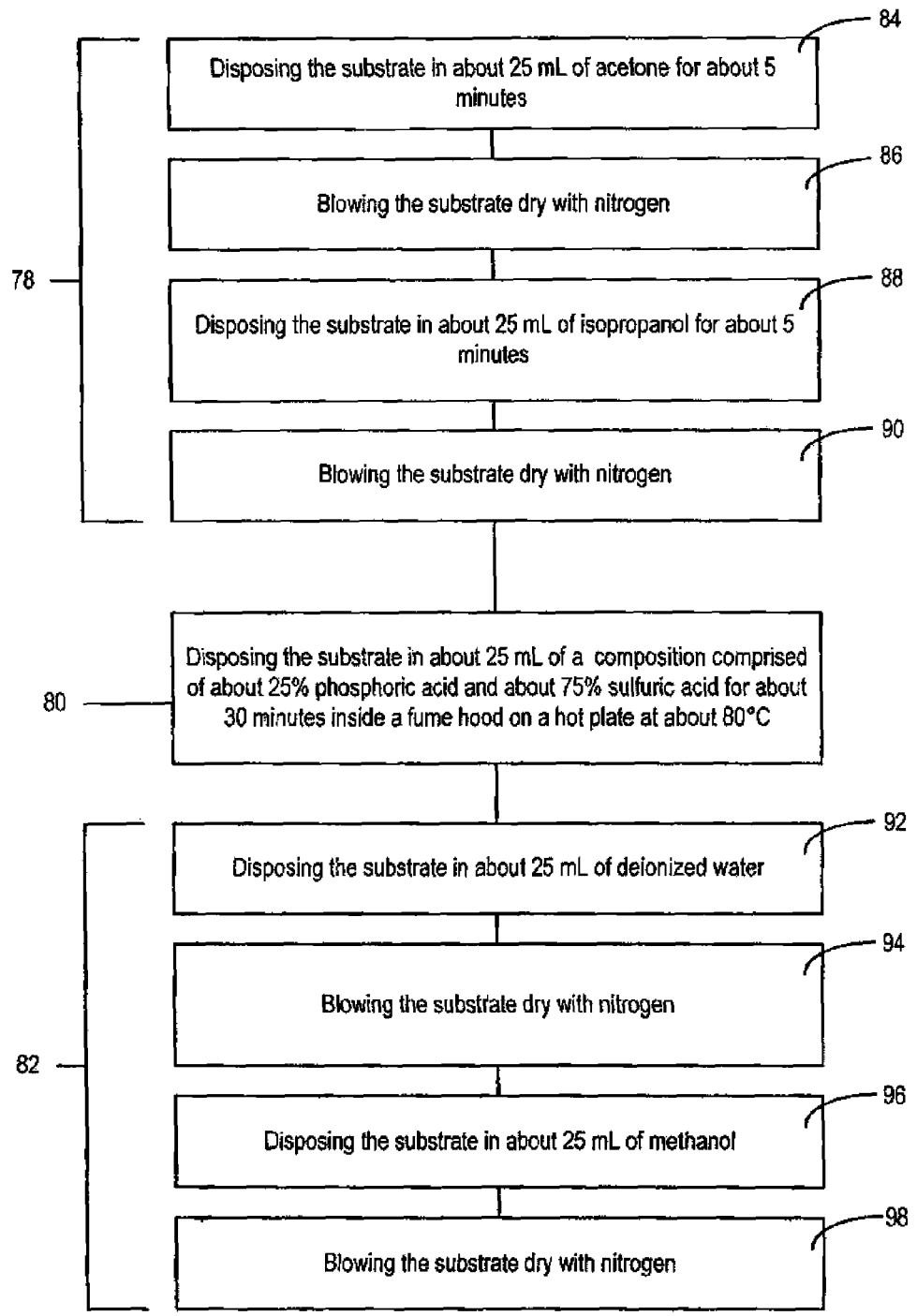
FIG. 4 is a block diagram illustrating a method of cleaning a sapphire substrate.

With reference to FIG. 4, a sapphire substrate 60 is preferably cleaned by giving the substrate 60 an ultrasonic bath 78 and exposing the substrate 60 to an etching procedure 80 and a rinsing procedure 82. The sapphire ultrasonic bath procedure 78 helps remove hydrocarbon residues and should be performed inside a fume hood.

Preferably, the sapphire ultrasonic bath procedure 78 for a sapphire substrate 60 includes a first step 84 of disposing the substrate 60 in about 25 mL of acetone for about five minutes. A second step 86 includes blowing the substrate 60 dry with nitrogen. A third step 88 includes disposing the substrate 60 in about 25 mL of isopropanol for five minutes. A fourth step 90 includes blowing the substrate 60 dry with nitrogen.

The preferred etching procedure 80 for a sapphire substrate 60 is performed for the purpose of removing surface contaminants and mechanical damage due to polishing. The etching procedure 80 includes disposing the substrate in about a 25 mL composition comprised of about 25% phosphoric acid ($H_3PO_4$) and about 75% sulfuric acid ($H_2SO_4$), for thirty minutes on a hot plate at about 80° Celsius.

Preferably, the rinsing procedure 82 is performed inside a fume hood. The rinsing procedure 82 includes a first step 92 of disposing the substrate in about 25 mL of deionized water. A second step 94 includes blowing the substrate 60 dry with nitrogen. A third step 96 involves disposing the substrate 60 in about 25 mL of methanol. A fourth step 98 involves blowing the substrate dry with nitrogen.

Figure 5:
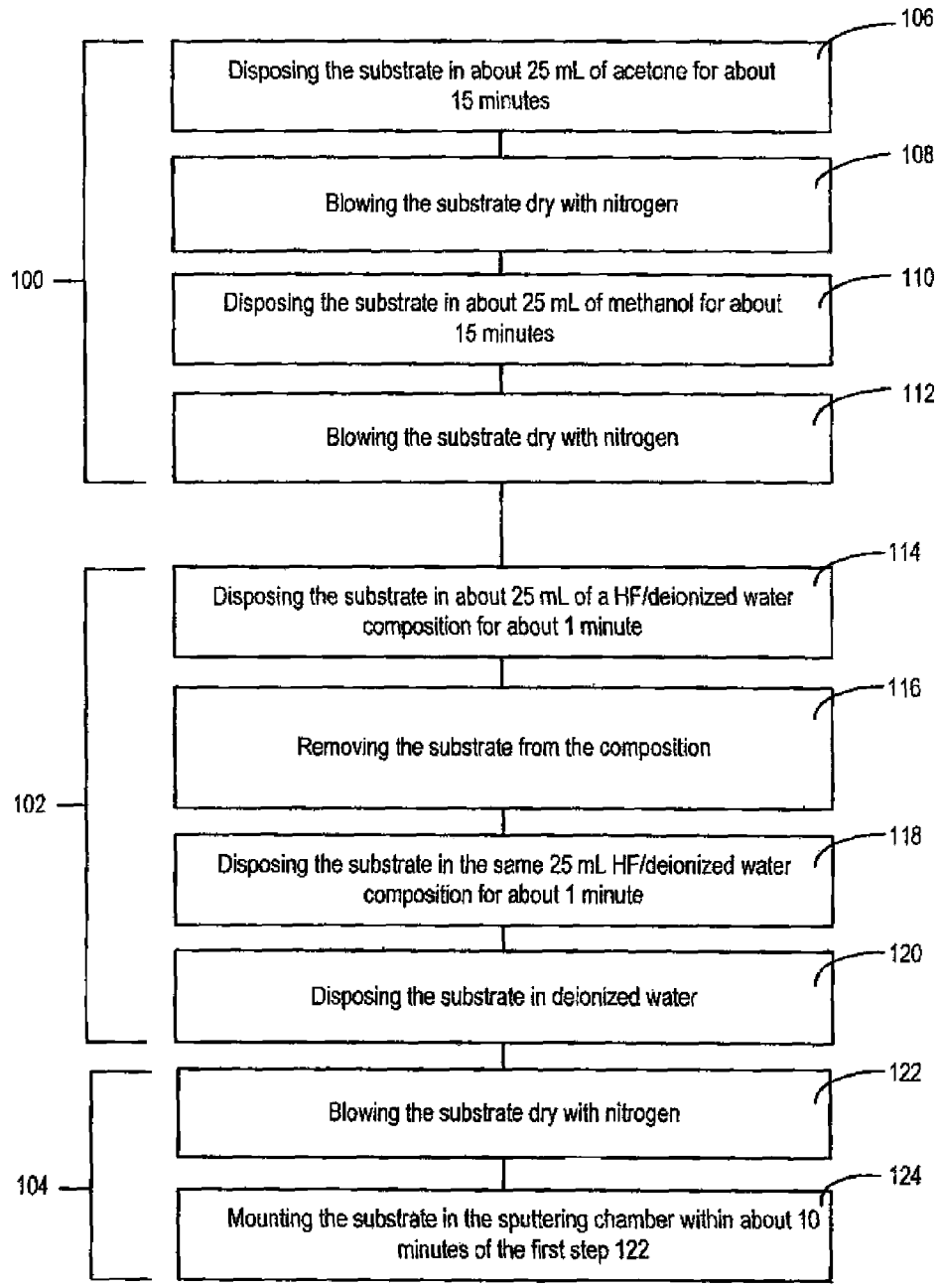
FIG. 5 is a block diagram illustrating a method of cleaning a silicon substrate.

With reference to FIG. 5, a silicon wafer substrate 60 is preferably cleaned by giving the substrate 60 an ultrasonic bath 100 and exposing the substrate 60 to an etching procedure 102 and a drying procedure 104. The silicon wafer ultrasonic bath procedure 100 helps remove residues from the substrate and should be performed inside a fume hood.

Preferably, the silicon wafer ultrasonic bath procedure 100 for a silicon wafer substrate 60 includes a first step 106 of disposing the substrate 60 in about 25 mL of acetone for about fifteen minutes. In this example, a second step 108 includes blowing the substrate 60 dry with nitrogen. A third step 110 includes disposing the substrate 60 in about 25 mL of methanol for about fifteen minutes. In this example, a fourth step 112 includes blowing the substrate 60 dry with nitrogen.

Preferably, the etching procedure 102 for a silicon wafer substrate 60 includes a first step 114 of disposing the substrate in about a 25 mL composition comprised of about 10% hydrofluoric acid (HF) and about 90% deionized water, for one minute. In this example, a second step 116 includes removing the substrate 60 from the composition. A third step 118 includes again disposing the substrate into the same 25 mL composition comprised of about 10% hydrofluoric acid (HF) and about 90% deionized water, for one minute. In this example, a fourth step 120 includes disposing the substrate in deionized water.

Preferably, the drying procedure 104 is performed inside a fume hood. The drying procedure 104 includes a first step 122 of blowing the substrate 60 dry with nitrogen. A second step 124 includes mounting the substrate in the sputtering chamber 20 within about ten minutes of the first step 122.

Figure 6:
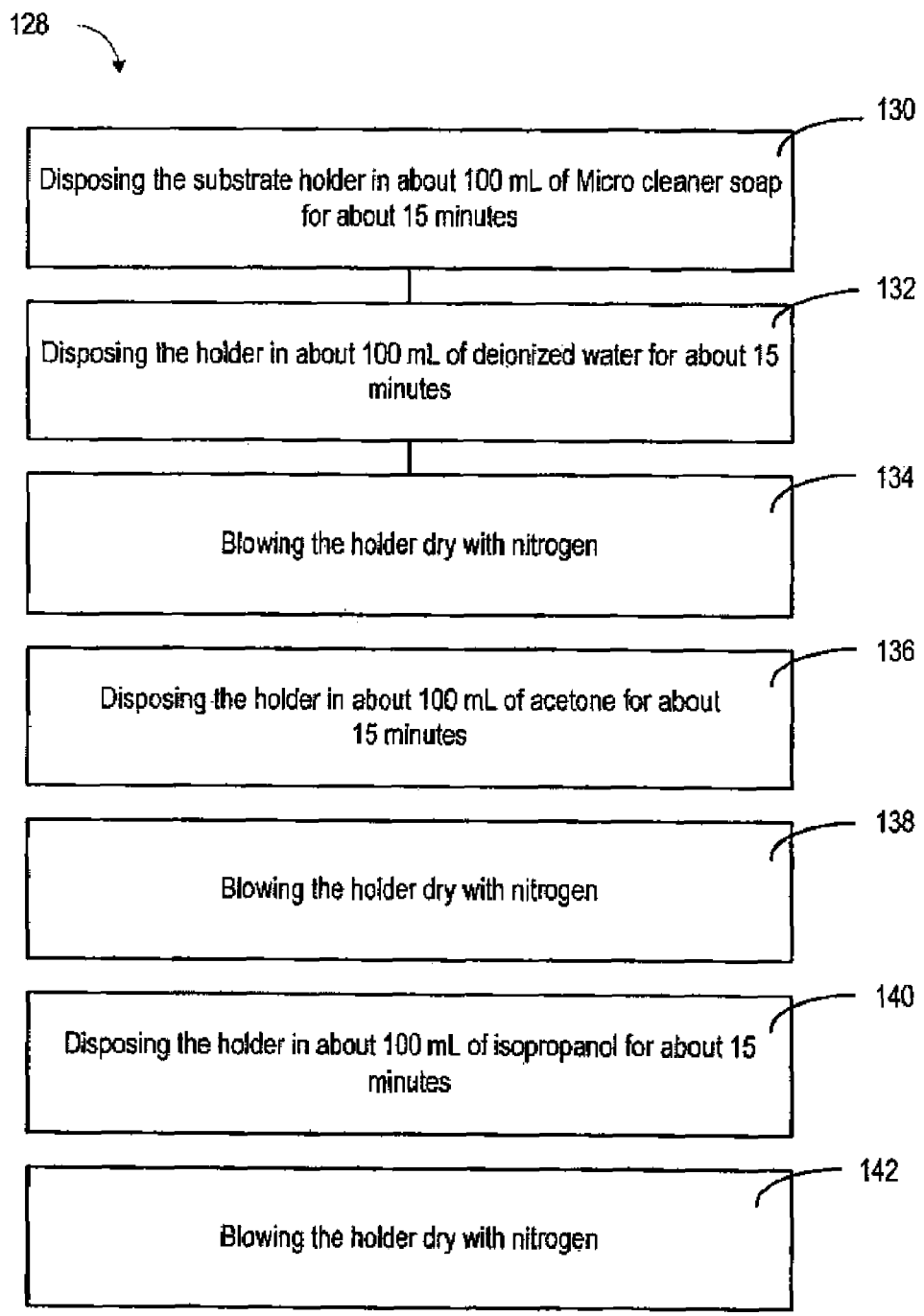
FIG. 6 is a block diagram illustrating a method of cleaning a substrate holder.

Prior to mounting the substrate 60 in the sputtering chamber 20, it is preferable to clean the substrate holder 50. With reference to FIG. 6, the substrate holder 50 may be cleaned using a holder ultrasonic bath procedure 128, inside a fume hood. The holder ultrasonic bath procedure 128 includes a first step 130 of disposing the substrate holder 50 in about 100 mL of Micro cleaner soap (about 90% deionized water and about 10% soap) for fifteen minutes. In this example, a second step 132 includes disposing the holder 50 in about 100 mL of deionized water for fifteen minutes. A third step 134 includes blowing the holder 50 dry with nitrogen. A fourth step 136 includes disposing the holder in about 100 mL of acetone for about fifteen minutes. In this example, a fifth step 138 includes blowing the holder 50 dry with nitrogen. A sixth step 140 includes disposing the holder 50 in about 100 mL of isopropanol for fifteen minutes. A seventh step 142 includes blowing the holder 50 dry with nitrogen.

Figure 7:
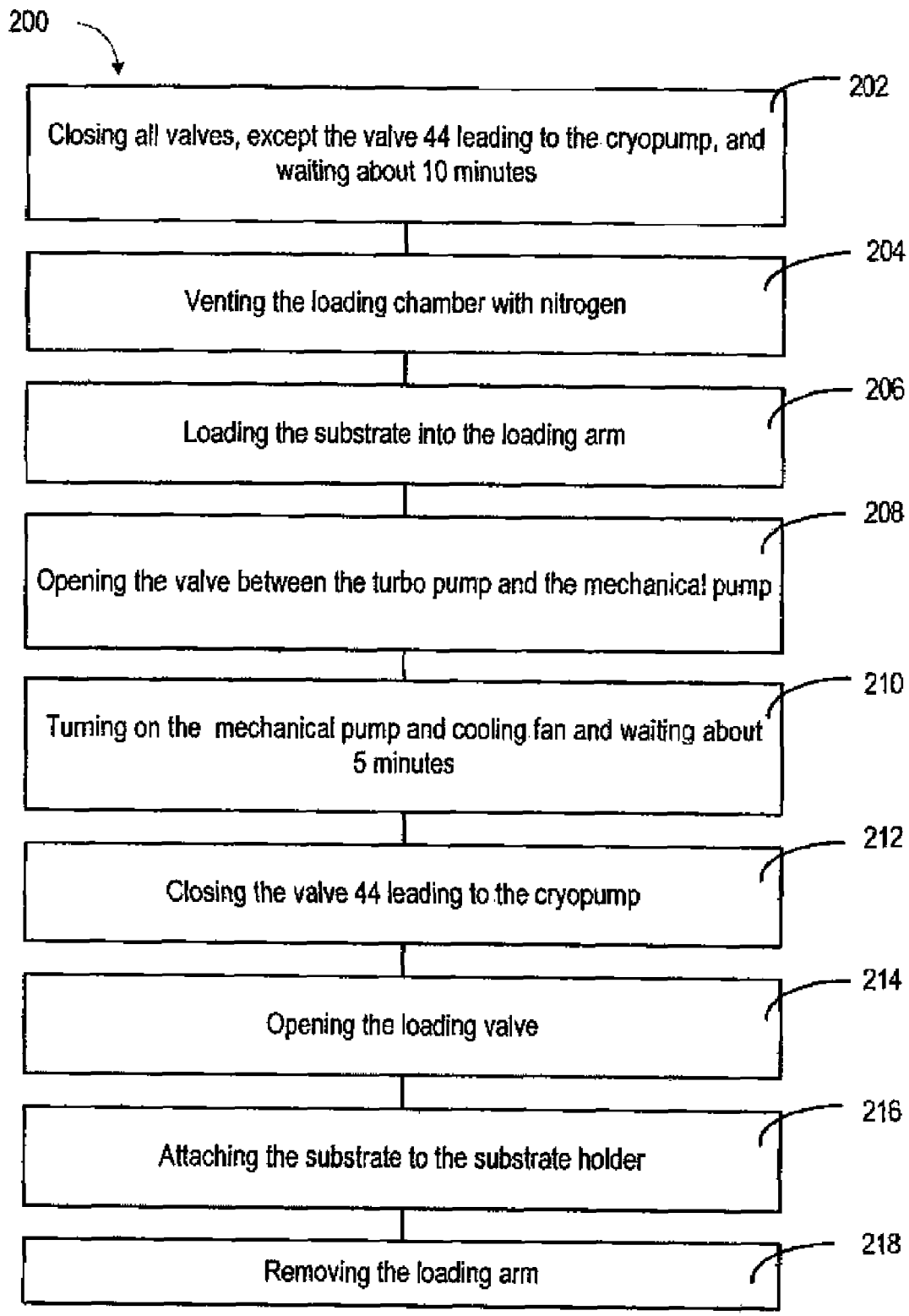
FIG. 7 is a block diagram illustrating a method of loading a substrate into the sputtering chamber of FIG. 2.

Before beginning the sputtering process 12, the titanium source 22 and the substrate 60 are loaded into the sputtering chamber 20. The titanium source 22, preferably having an ultra high purity of about 99.995%, is preferably loaded into the chamber 20 before changing the ambient conditions of the chamber 20, by opening a cover (not shown) of the chamber 20. With reference to FIG. 7, the substrate 60 may be loaded using, for example, the substrate loading procedure 200. In one example, the substrate loading procedure 200 involves a first step 202 of closing all valves except the valve 44 leading to the cryopump 42, and waiting ten minutes. A second step 204 includes venting the loading chamber 30 with nitrogen. A third step 206 includes loading the substrate 60 into the loading arm 28. In this example, a fourth step 208 includes opening the valve 36 between the turbo pump 34 and the mechanical pump 40. A fifth step 210 includes turning on the mechanical pump 40 and a cooling fan (not shown) and waiting five minutes. A sixth step 212 includes closing the valve 44 leading to the cryopump 42. A seventh step 214 includes opening the loading valve 32. In this example, an eighth step 216 includes attaching the substrate 60 to the substrate holder 50. A ninth step 218 includes removing the loading arm 28.

It is preferable to bring the chamber 20 to a base pressure of approximately $5.0 \times 10^{-7}$ Torr by opening the valve to the cryopump 44 before beginning the sputtering process 14. It is also preferable to activate the heater 48 before beginning the sputtering process 14, and to bring the chamber to a temperature between about 25° C. to about 500° C., and more preferably, to a temperature of about 250° C. before beginning the sputtering process 14.

It is preferable to introduce argon, preferably having an ultra high purity of about 99.9993%, to the chamber 20 at a flow rate of approximately 45 to 50 sccm. The valve 44 leading to the cryopump 42 may then be closed to reach a preferred growth pressure of about 3 to 5 mTorr, and more preferably, of about 4.0 mTorr.

The magnetron reactive sputtering process 14 is preferably performed by turning on the Pulsed DC Plasma Generator 26 at a starting power of about 50 Watts and increasing the power gradually until a power of preferably about 350 to 500 Watts is reached, and more preferably, about 400 Watts. It is preferable to wait about ten minutes after having the Pulsed DC Plasma Generator 26 set to the desired power level. Thereafter, it is preferable to activate the rotator 46 to rotate the substrate 50, preferably at a rate of about 6 r.p.m. Oxygen, preferably having an ultra high purity of about 99.994%, should then be introduced into the chamber 20 via one of the gas intake tubes 54, preferably at a rate of about 6 to 8 sccm. A negative voltage should be provided to the substrate 60, preferably, the voltage should be about −12 Volts.

The Pulsed DC Plasma Generator 26 creates a sputtering process that is pulsed to vaporize the titanium; however, it is contemplated that a thin film titanium dioxide could be created without providing pulses, without falling beyond the spirit and scope of the present invention. The pulses are preferably provided at a frequency of about 250 kHz. Furthermore, the Pulsed DC Plasma Generator uses direct current (DC) power; however, other types of power could be utilized with the present invention.

During the sputtering process 14, oxygen will react with vaporized titanium to form titanium dioxide, and a thin film of titanium dioxide will be deposited on the substrate 60. The film can be deposited with the desired thickness by varying the amount of time that the substrate 60 is left in the chamber 60, which will be described in further detail below. Preferably, a titanium dioxide thin film is deposited on the substrate 60 as a single-phase anatase titanium dioxide; however, it is contemplated that the titanium dioxide could comprise other phases, such as a mixed phase including a crystalline and amorphous structure. Preferably, the film has a thickness of between about 100 and 1000 nm.

EXAMPLES

Anatase titanium dioxide thin films were grown using the above-described parameters and processes, and crystalline structure and size were determined by means of θ/2θ XRD scans using Rigaku-Rotaflex RU2000 diffractometer system (Geigerflex X-ray goniometer unit) with a copper source. JADE XRD pattern processing (MDI) was used to collect and process the data. The Raman spectra were recorded in a backscattering geometry using a Renishaw InVia Raman-microscope system and the 514.5 excitation wavelength of an argon ion laser, focused to a spot size of about 3 μm. The Raman peak positions were obtained by curve-fitting with the line shapes Gaussians, to spectra shapes of the raw data obtained from the spectrometer. The X-ray photoelectron spectroscopy (XPS) was performed on a PHI 5500 system, using a monochromatic Al Kα source. Depth profiling was performed using an argon ion sputtering gun, at a pressure of about 2-4×10$^{-8}$ Torr. All measurements were performed at about a 45° take-off angle.

For insulating samples, an electron flood gun was used to remove the positive surface charging. For most samples, a broad survey scan was performed initially to identify all elements present. Following this, a higher resolution scan was performed around the elemental regions of interest. The XPS spectra positions and full widths at half maximum for all the titanium dioxide films were obtained by fitting Gaussians to spectra shapes. Surface morphology was characterized by AFM at room temperature using a Park Scientific Instruments Autoprobe. All the scanning was in contact mode using silicon nitride tips. Image analysis was performed using ProScan Software Version 1.5.

Figure 8:
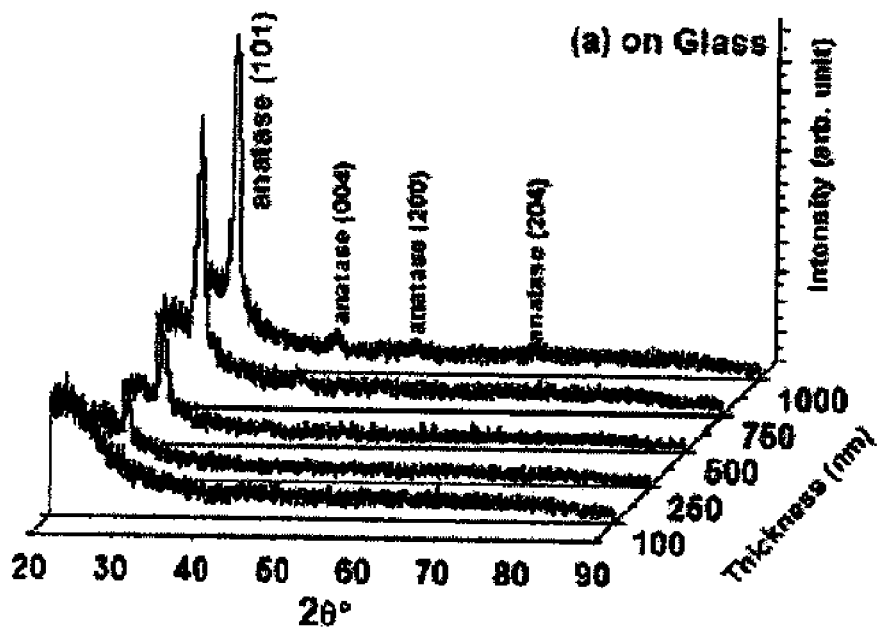
FIG. 8 is a graph illustrating the X-ray diffraction of five different thicknesses of anatase titanium dioxide film deposited on a glass substrate.
Figure 9:
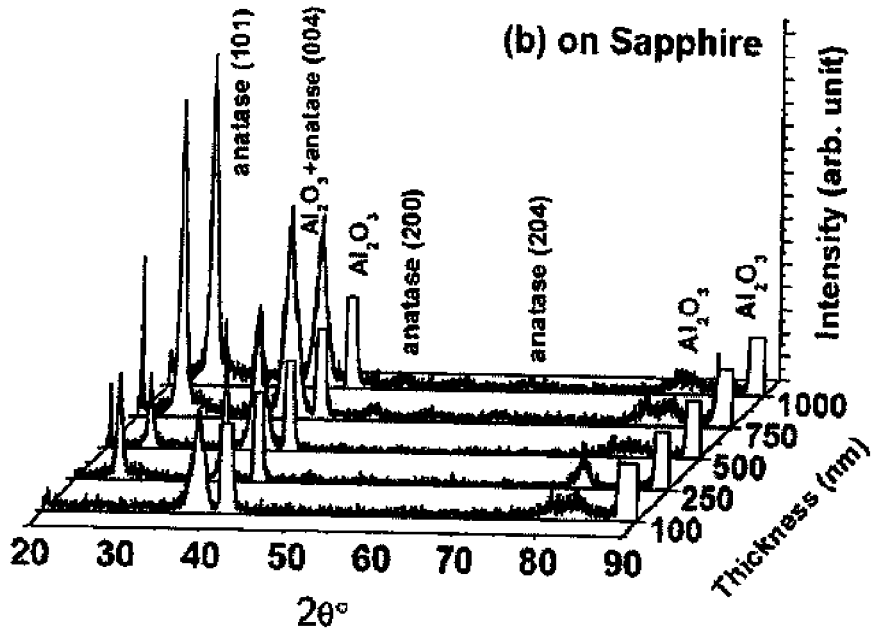
FIG. 9 is a graph illustrating the X-ray diffraction of five different thicknesses of anatase titanium dioxide film deposited on a sapphire substrate.
Figure 10:
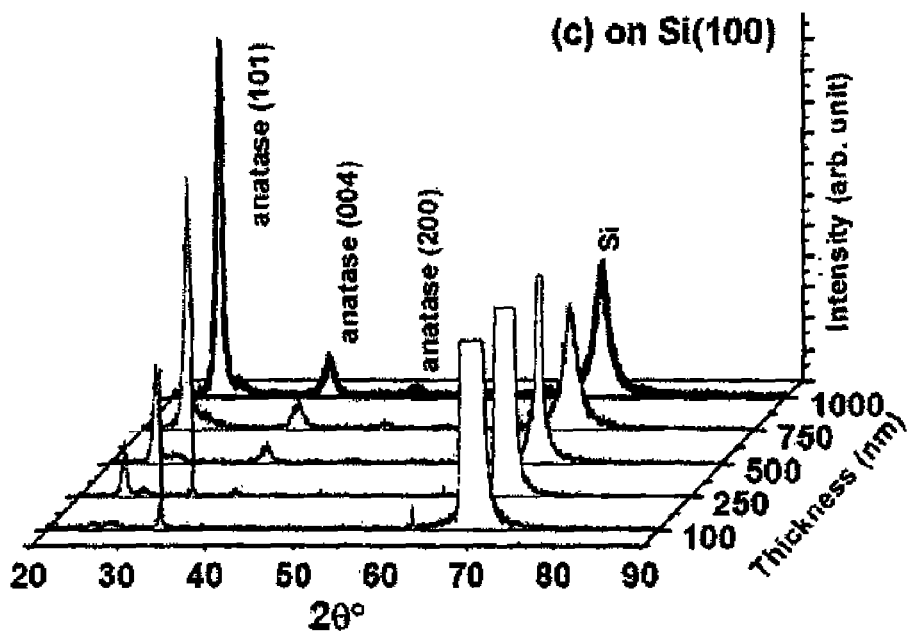
FIG. 10 is a graph illustrating the X-ray diffraction of five different thicknesses of anatase titanium dioxide film deposited on a silicon substrate.

Titanium thin films of five different thicknesses (100, 250, 500, 750, and 1000 nm) were grown on substrates 60 of glass, sapphire (0001), and silicon (100). With reference to FIGS. 8-10, the X-Ray diffraction of the five different thicknesses of titanium dioxide film deposited on the glass, sapphire, and silicon substrates are shown. The X-ray diffraction confirmed that only single-phase anatase was present in the thin films. All the observed sharp peaks could be indexed based on the anatase single-phase structure, or assigned to substrate reflections, as indicated in FIGS. 8-10. High peak at 25.22° and very small peaks at 37.75° and 47.72° were observed, which correspond to anatase (101), (004), and (200) reflections respectively, and there is no evidence of any rutile phase titanium dioxide. The measurements indicate that (101) is the preferred growth orientation of the crystallites. The Scherrer equation was used to determine the average crystal sizes of the titanium dioxide nanoparticles:

$$t = \frac{0.9\lambda}{\beta \cdot \cos\theta} \quad (1)$$

where t is the crystallite size, λ is the X-ray wavelength used, β is the broadening of diffraction line measured as half of its maximum intensity, and θ is the corresponding angle. The average crystallite sizes of the anatase titanium dioxide thin films were found to be 10-13 nm on the glass substrate, 11-13 nm on the silicon substrate, and 10-12 nm on the sapphire substrate.

Figure 11:
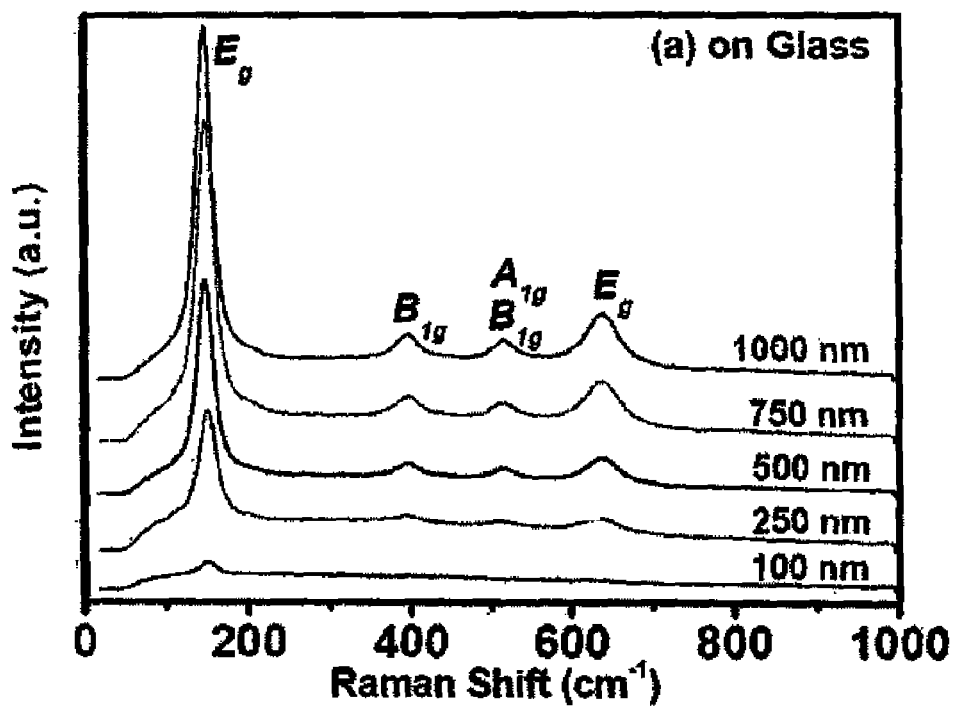
FIG. 11 is a graph illustrating the Raman spectra of anatase titanium dioxide thin films with five different thicknesses deposited on a glass substrate with an excitation wavelength of 514 nm.
Figure 12:
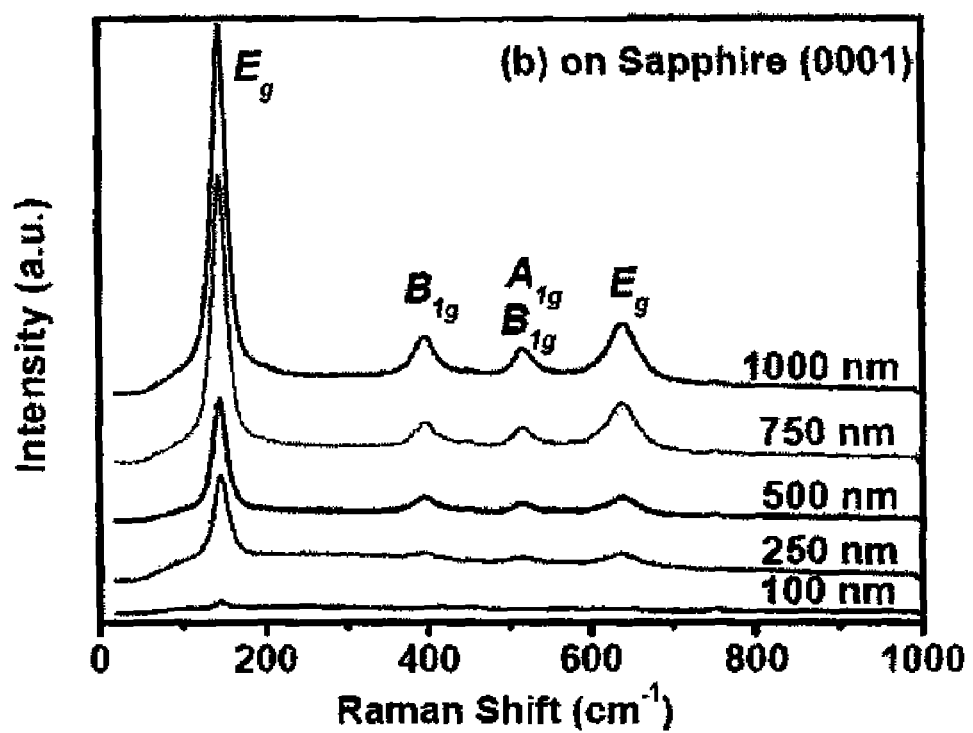
FIG. 12 is a graph illustrating the Raman spectra of anatase titanium dioxide thin films with five different thicknesses deposited on a sapphire substrate with an excitation wavelength of 514 nm.
Figure 13:
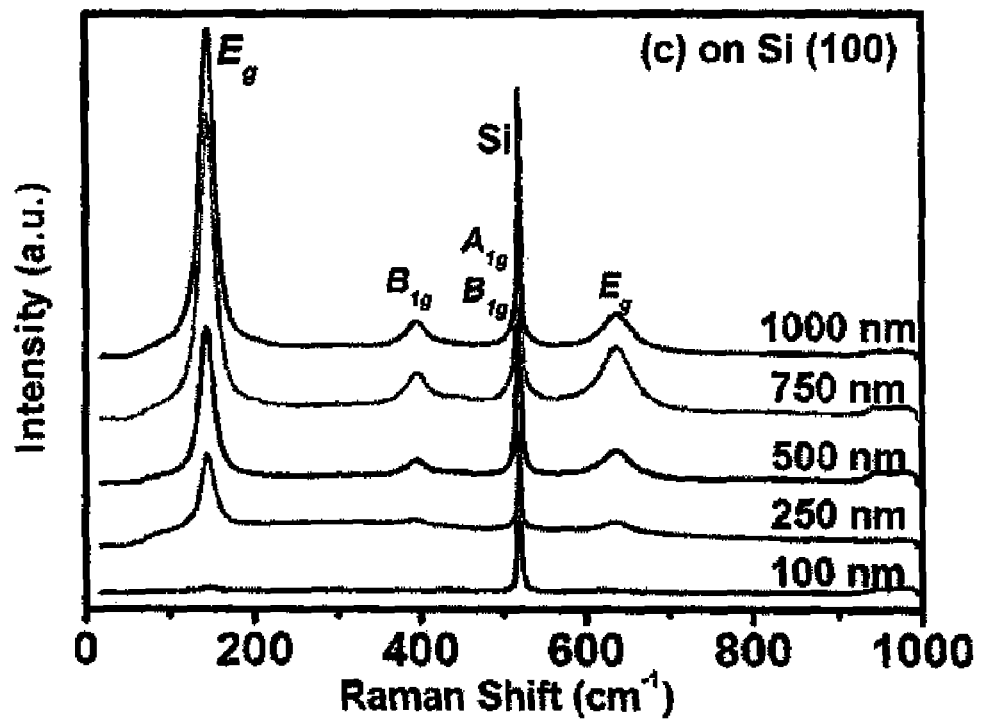
FIG. 13 is a graph illustrating the Raman spectra of anatase titanium dioxide thin films with five different thicknesses deposited on a silicon substrate with an excitation wavelength of 514 nm.

With reference to FIGS. 11-13, the anatase thin films Raman spectra on glass, sapphire (0001), and silicon (100) are shown using a wavelength of 514.5 nm. The frequencies of the Raman bands are identified as follows: 147.3 (±2.8) cm$^{-1}$ peaks are assigned to the $E_g$ phononic modes ($v_6$), 392.8 (±4.3) cm$^{-1}$ peaks are assigned to the $B_{1g}$ phononic mode ($v_4$), 515.2 (±5.3) cm$^{-1}$ peaks can be attributed to the $A_{1g}$ phononic mode ($v_2$), 513.14 (±7.4) cm$^{-1}$ peaks can be attributed to the $B_{1g}$ phononic mode ($v_3$), and 628.8 (±10.2) cm$^{-1}$ peaks can be attributed to the $E_g$ phononic mode ($v_1$), based on the factor group analysis. From the factor plane analysis, it was observed that both $A_{1g}$ ($v_3$) and $B_{1g}$ ($v_2$) modes involve the Ti—O bond stretching normal to the film plane. The intensity of the Raman spectrum of the thin film increases with film thicknesses. The positions of the major peaks are all shifted with respect to the corresponding frequencies in the bulk material.

Figure 14:
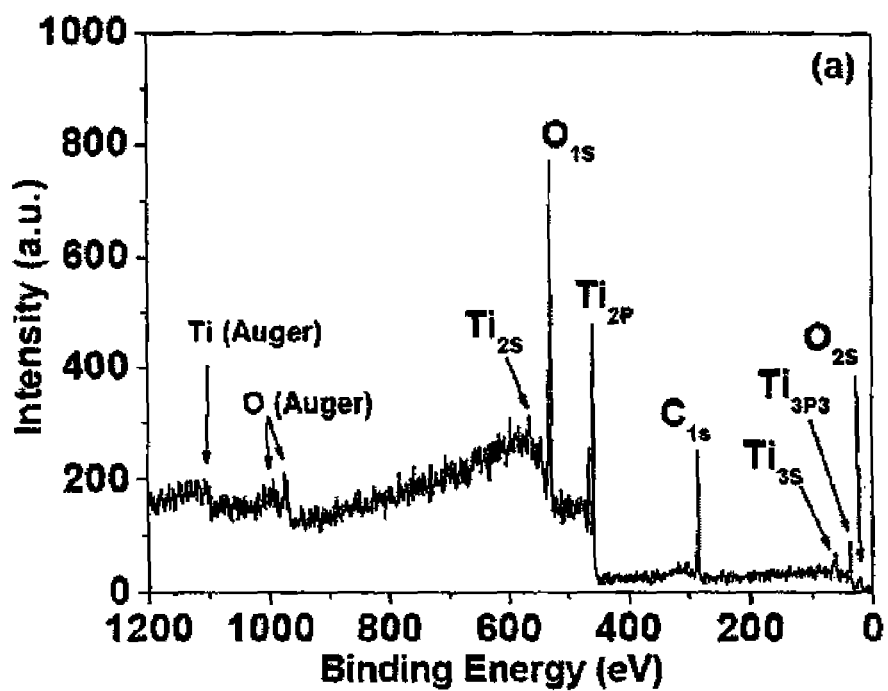
FIG. 14 is a graph illustrating the XPS spectrum for an anatase titanium dioxide thin film having a thickness of 1000 nm deposited on a sapphire substrate before sputtering.
Figure 15:
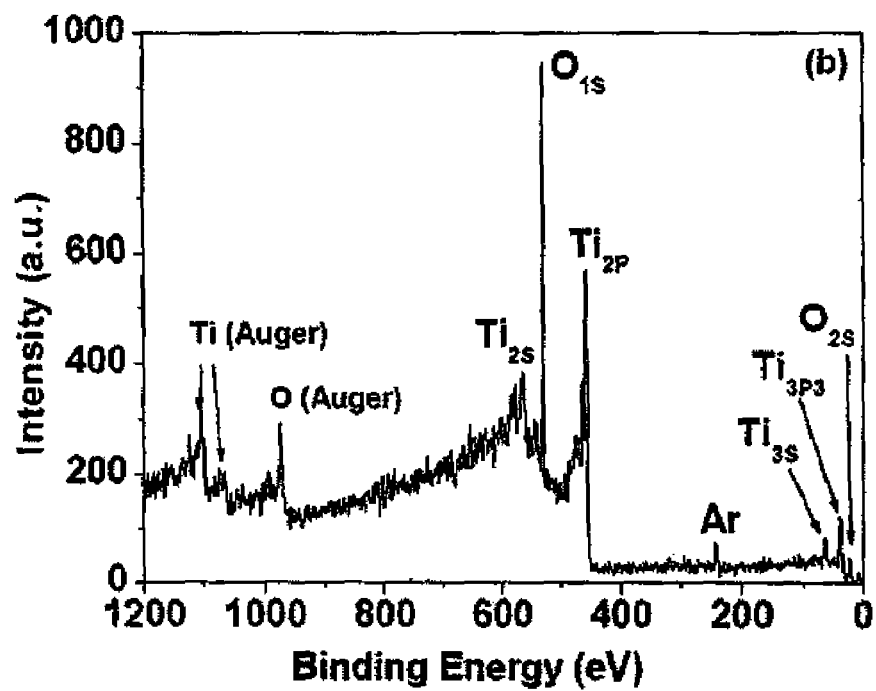
FIG. 15 is a graph illustrating the XPS spectrum for an anatase titanium dioxide thin film having a thickness of 1000 nm deposited on a sapphire substrate thirty seconds after sputtering.

XPS measurements for the titanium dioxide were made to detect the chemical states of the thin films and to determine all elements present in the films. FIG. 14 shows the XPS spectrum before sputtering, and FIG. 15 shows the XPS spectrum after thirty seconds of sputtering. Only lines characteristic of titanium (Ti2p), oxygen (O1s), argon (Ar1s), and carbon (C1s) can be observed. The C1s peak disappears after thirty seconds of sputtering.

Figure 16:
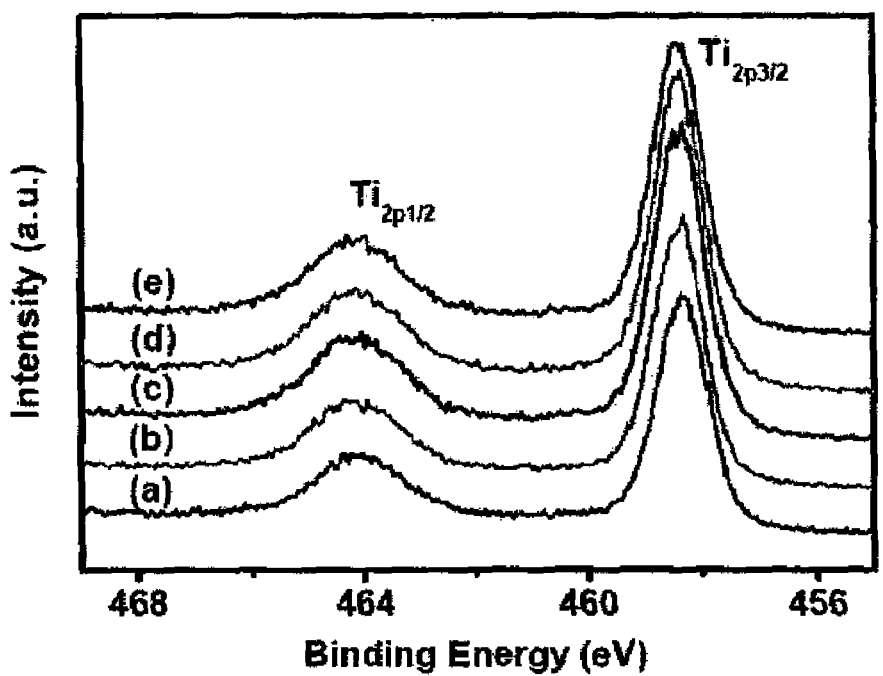
FIG. 16 is a graph illustrating the titanium composition of anatase titanium dioxide thin films deposited on sapphire substrates having five different thicknesses.
Figure 17:
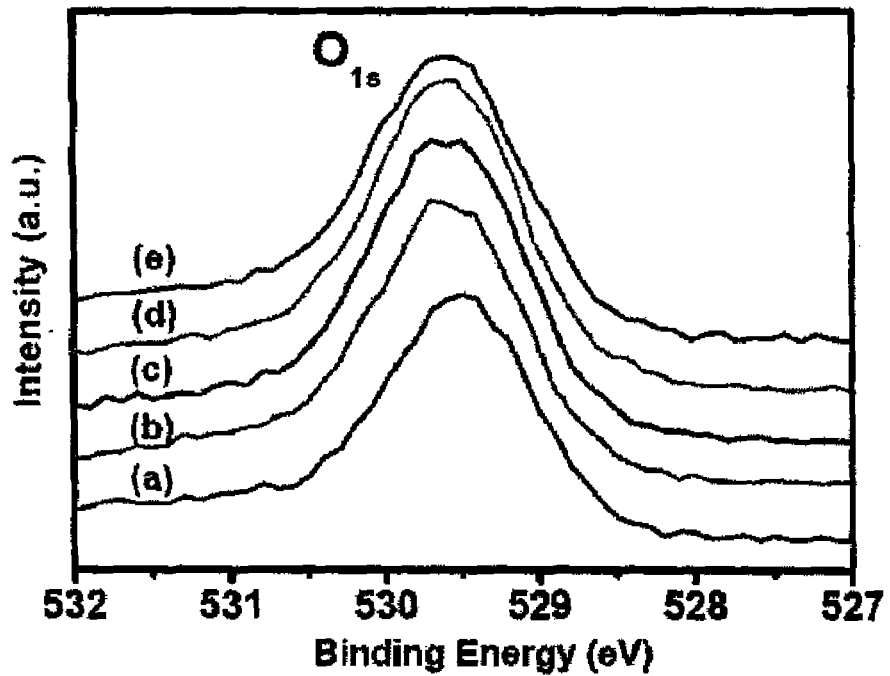
FIG. 17 is a graph illustrating the oxygen composition of anatase titanium dioxide thin films deposited on sapphire substrates having five different thicknesses.

With reference to FIGS. 16 and 17, the composition of the titanium dioxide thin films on sapphire (0001) substrates is shown, with thin films having thicknesses of (a) 100 nm, (b) 250 nm, (c) 500 nm, (d) 750, and (e) 1000 nm. These composition values comport with values known for stoichiometric anatase phase titanium dioxide.

Figure 18:
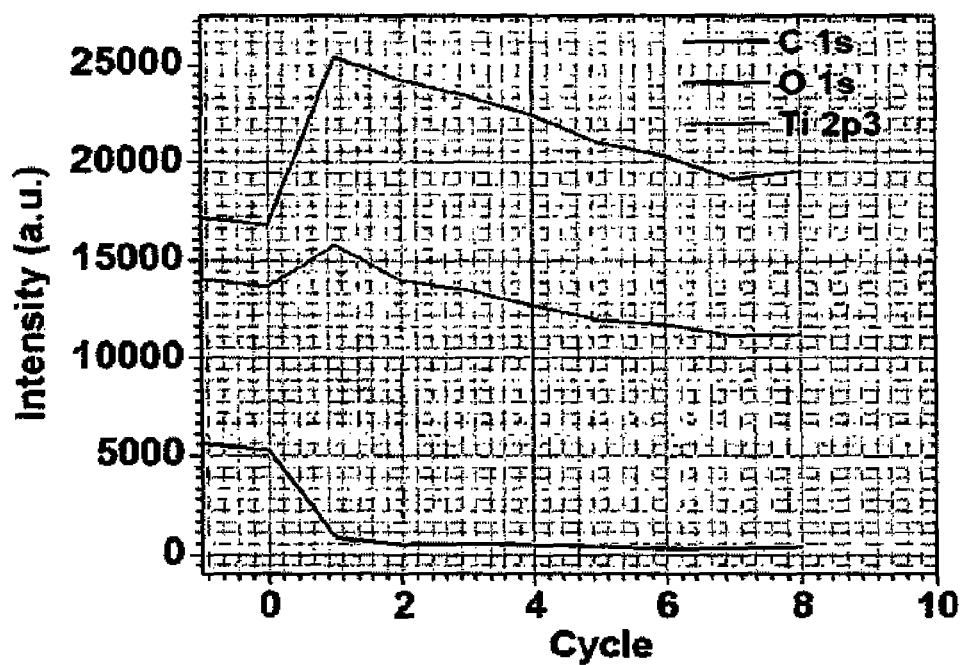
FIG. 18 is a graph illustrating the XPS spectrum depth profile for an anatase titanium dioxide thin film having a thickness of 1000 nm, deposited on a sapphire substrate.

An oxygen versus titanium atomic ratio of 1.95±0.05, based on the O1s with Ti2p$_{3/2}$ XPS peaks were observed for all samples before sputtering, which indicates a perfectly stoichiometric titanium dioxide surface. A depth profile for anatase titanium dioxide thin film (1000 nm) was done for ten cycles, with fifteen seconds of sputtering proceeding every one of the last eight cycles. The intensity of the film's elements (C1s, O1s, and Ti2p) before and after eight cycles of sputtering is illustrated in FIG. 18, which shows that the film has an excess of oxygen near the surface, and there is constant stoichiometry after sputtering. The area of the C1s peak decreases after thirty seconds of sputtering, which is evidence that the thin films are not contaminated with carbon from the deposition process.

Figure 19A:
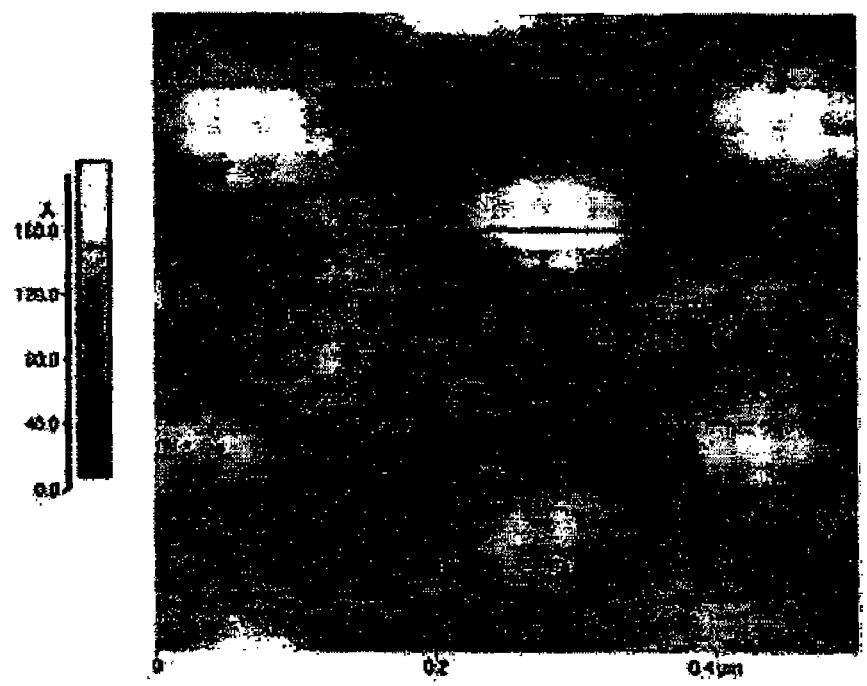
FIG. 19A is an AFM image profile of an anatase titanium dioxide film having a thickness of 100 nm, on a sapphire substrate with a scan area of 500×500 nm.
Figure 19B:
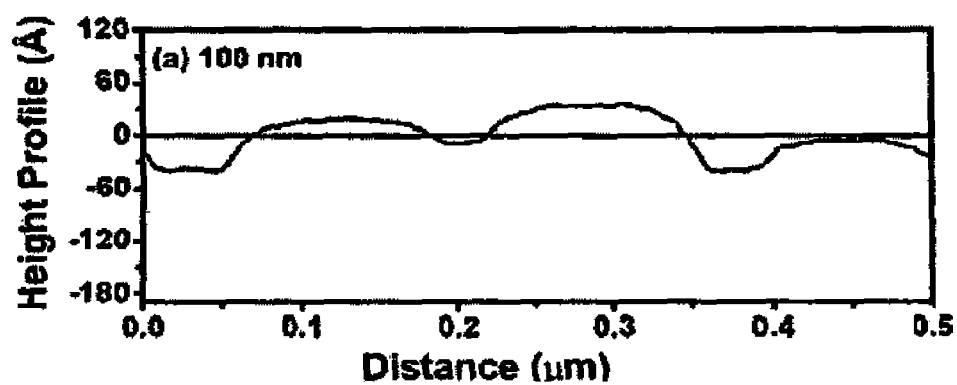
FIG. 19B is a graph illustrating an AFM height profile of an anatase titanium dioxide film having a thickness of 100 nm, on a sapphire substrate with a scan area of 500×500 nm.
Figure 20A:
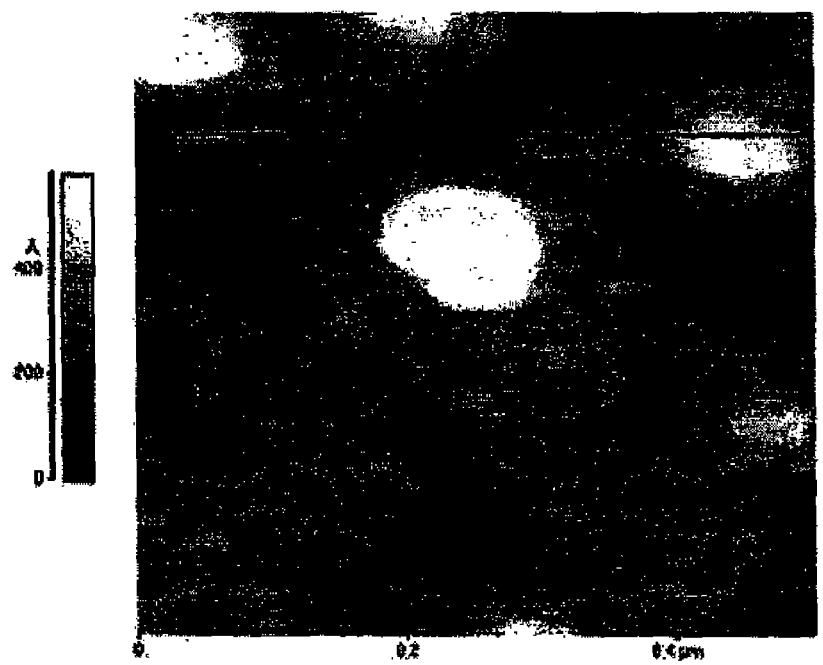
FIG. 20A is an AFM image profile of an anatase titanium dioxide film having a thickness of 500 nm, on a sapphire substrate with a scan area of 500×500 nm.
Figure 20B:
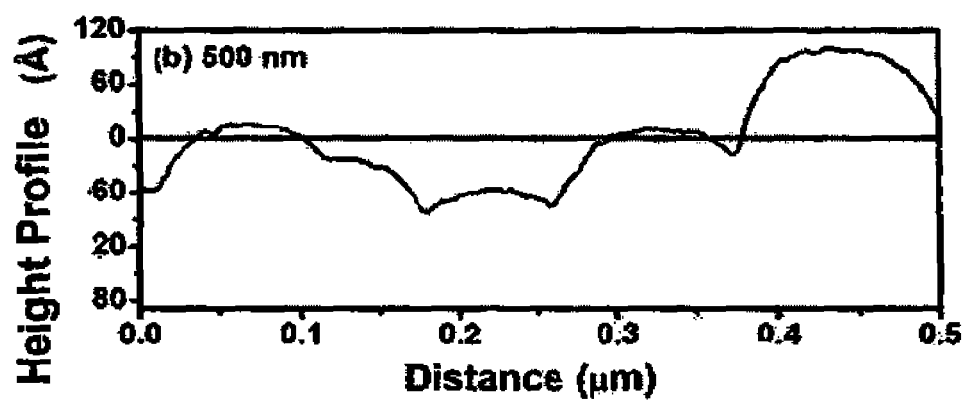
FIG. 20B is a graph illustrating an AFM height profile of an anatase titanium dioxide film having a thickness of 500 nm, on a sapphire substrate with a scan area of 500×500 nm.
Figure 21A:
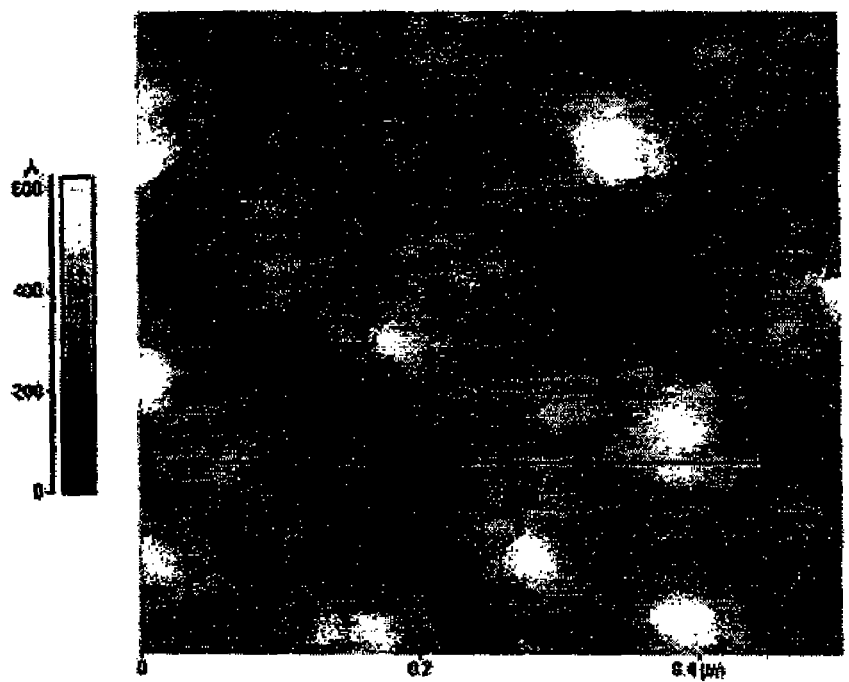
FIG. 21A is an AFM image profile of an anatase titanium dioxide film having a thickness of 1000 nm, on a sapphire substrate with a scan area of 500×500 nm.
Figure 21B:
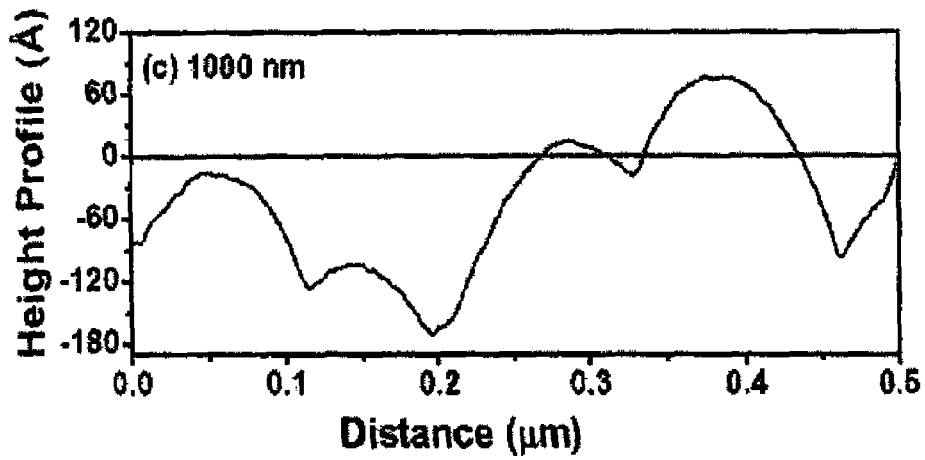
FIG. 21B is a graph illustrating an AFM height profile of an anatase titanium dioxide film having a thickness of 1000 nm, on a sapphire substrate with a scan area of 500×500 nm.

With reference to FIGS. 19-21, the surface morphologies of as-deposited titanium oxide thin films structure on glass, sapphire (0001), and silicon (100) were characterized by AFM with contact mode at room temperature. FIGS. 19-21 show the AFM 2D morphology images and surface height profiles of the titanium dioxide thin films having thicknesses of 100 nm, 500 nm, and 1000 nm on sapphire (0001) substrates, with a scan area of 500×500 nm. The grains are sphere-like with 20-100 nm diameters.

Figure 22:
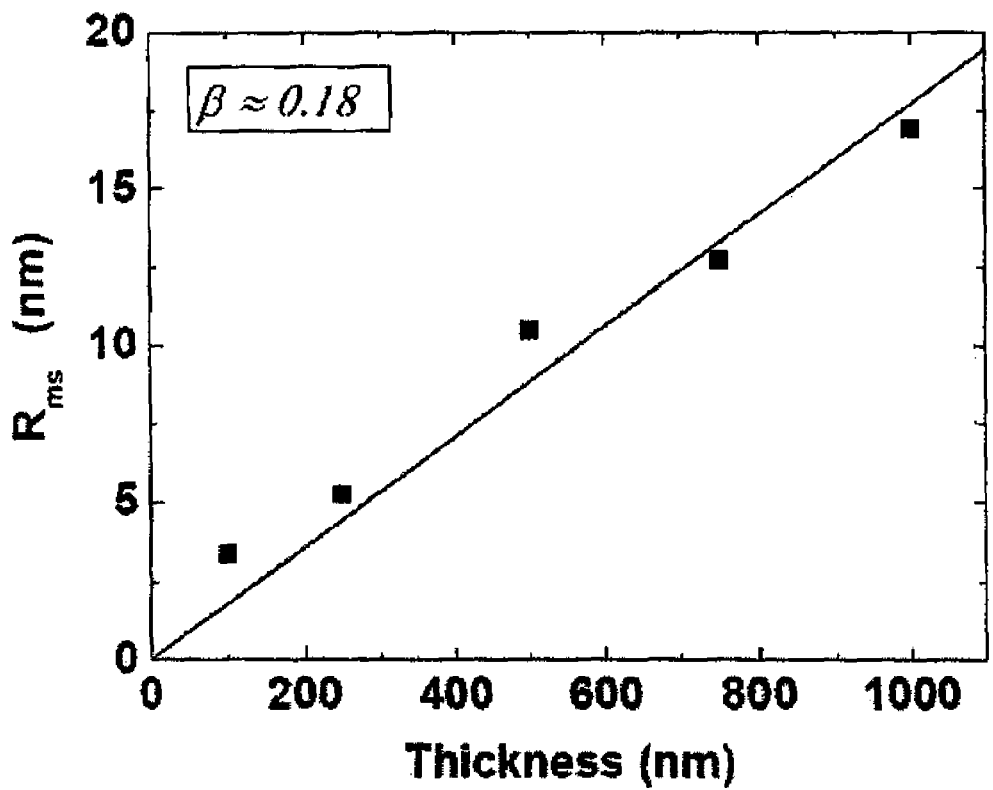
FIG. 22 is a graph illustrating Roughness (root mean square) versus film thickness for an anatase titanium dioxide film on a sapphire substrate, with a scan size of 500×500 nm.
Figure 23:
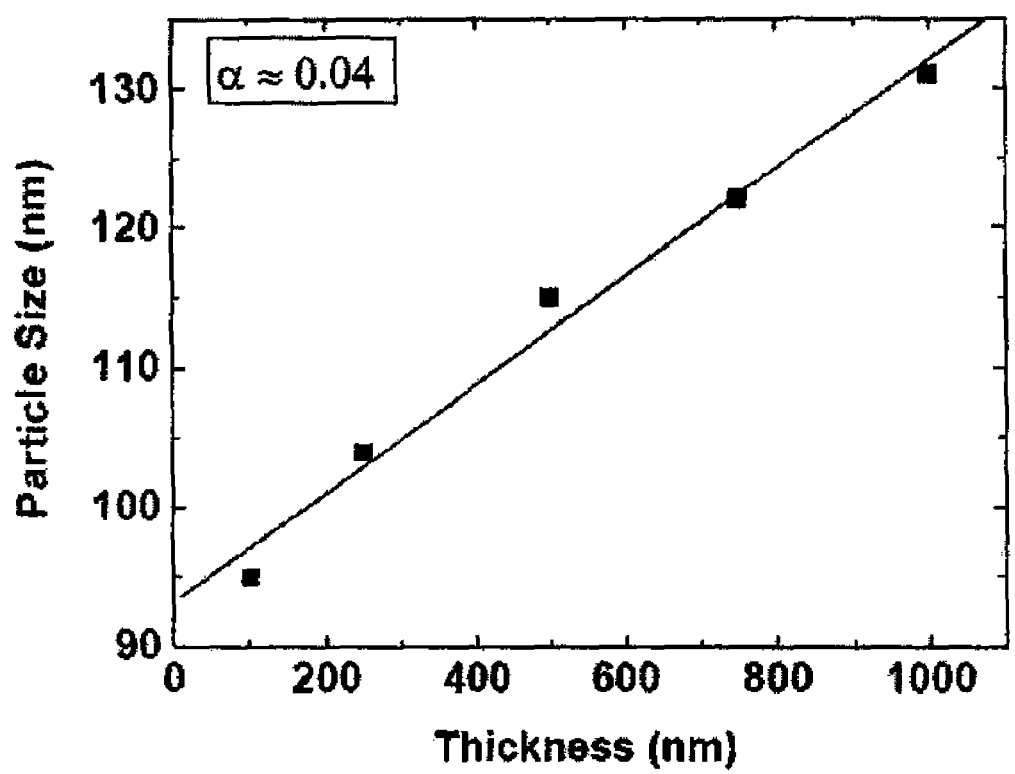
FIG. 23 is a graph illustrating particle size versus film thickness for an anatase titanium dioxide film on a sapphire substrate, with a scan size of 500×500 nm.

With reference to FIGS. 22-23, the roughness and particles size of the film depends on the film thickness. FIG. 22 shows the root mean square roughness ($R_{rms}$) as a function of thickness and FIG. 23 shows the particle sizes as a function of thickness. A scan area of 500×500 nm and sapphire substrates were used for these measurements.

Other Applications

Figure 24:
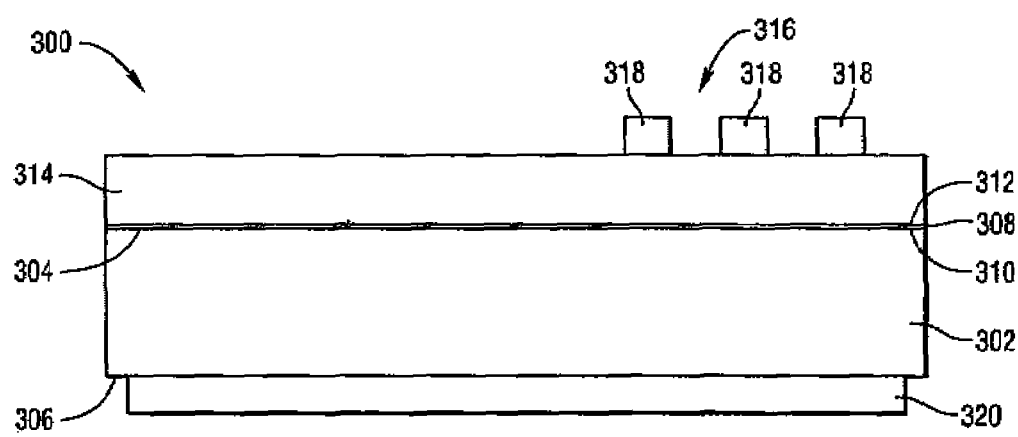
FIG. 24 is a schematic side view illustrating a solar cell embodying the principles of the present invention.

With reference to FIG. 24, a solar cell for converting photons into electricity is illustrated at 300. The solar cell includes a backing layer 302, which comprises a p-type semiconductor material. The p-type semiconductor material could be silicon or any other suitable p-type semiconductor material. The backing layer 302 has a front side 304 and a back side 306.

A p-n junction layer 308 is disposed on the backing layer 302. The p-n junction layer 308 has a first side 310 and a second side 312. The first side 310 is disposed on the front side 304 of the backing layer 302.

A metal-oxide layer 314 is disposed on the second side 312 of the p-n junction layer 308. The metal-oxide layer 314 is an n-type titanium dioxide film having a thickness in the range of about 100 to about 1000 nanometers. Preferably, the metal-oxide layer 314 is comprised of an n-type single-phase anatase titanium dioxide film.

A top electrical layer 316 is disposed on the metal-oxide layer 314. The top electrical layer 316 is shown having electrodes 318, although other configurations of the top electrical layer 316 could be utilized without falling beyond the spirit and scope of the present invention. The electrodes 318 are preferably comprised of platinum and preferably have an interdigital or grid pattern.

A contact layer 320 is disposed on the back side 306 of the backing layer 302. Preferably, the contact layer 320 is comprised of platinum and extends along most of the back side 306, as illustrated in FIG. 24.

The solar cell 300 may also comprise a dye disposed on the metal-oxide layer 314. The dye serves the purpose of absorbing incident photons and converting the photons to electrons.

Figure 25:
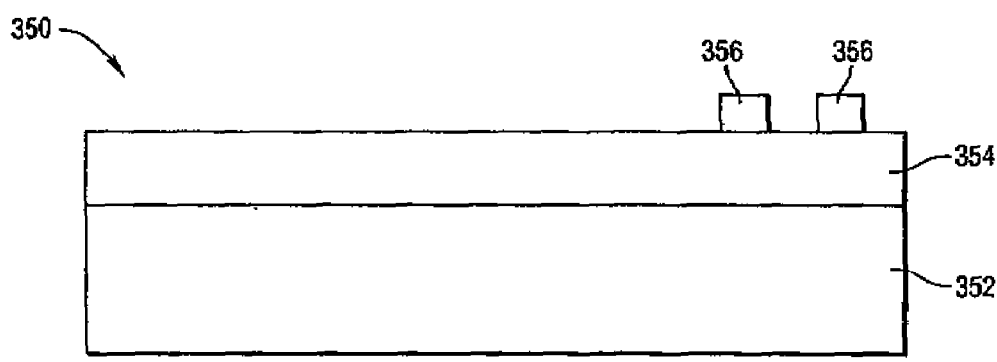
FIG. 25 is a schematic side view illustrating one embodiment of a carbon monoxide sensor embodying the principles of the present invention.

With reference to FIG. 25, a carbon monoxide sensor 350 for sensing gaseous carbon monoxide is illustrated. The sensor 350 comprises a substrate 352, which is preferably comprised of sapphire. An n-type titanium dioxide film 354 is disposed on the substrate 352. The film 354 has a thickness in the range of about 100 to about 1000 nanometers. The film 354 is preferably comprised of single-phase anatase. At least one electrode 356 for transmitting an electric signal is disposed on the film 354. The electrodes 356 preferably are comprised of platinum and form an interdigital pattern, although other patterns and materials may be used, such as a grid pattern, without falling beyond the spirit and scope of the present invention.

Figure 26:
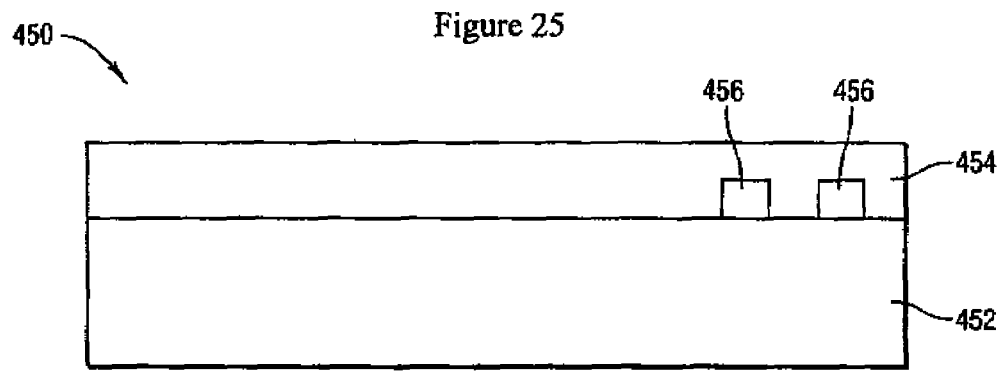
FIG. 26 is a schematic side view illustrating another embodiment of a carbon monoxide sensor embodying the principles of the present invention.

With reference to FIG. 26, another embodiment of a carbon monoxide sensor 450 embodying the principles of the present invention is illustrated. A titanium dioxide thin film 454 is disposed on a sapphire substrate 452. The thin film 454 has a thickness of about 100 to 1000 nm, and is preferably comprised of single-phase anatase. The electrodes 465 for transmitting an electrical signal are disposed on the substrate 452 under the thin film layer 454.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:

1. A thin-film metal-oxide compound comprising:
   a titanium dioxide layer having a thickness of about 100 to 1000 nanometers; the titanium dioxide layer having a single-phase anatase structure; and
   a substrate on which the titanium dioxide layer is directly disposed, the substrate being comprised of one of: glass, sapphire, and silicon.

2. The thin-film metal oxide compound of claim 1, wherein the substrate is comprised of one of the following materials: sapphire and silicon.

3. A solar cell for converting photons into electricity, the solar cell comprising:
   a backing layer comprising a p-type semiconductor material, the backing layer having a front side and a back side;
   a p-n junction layer having a first side and a second side, the first side being disposed on the front side of the backing layer;
   a metal-oxide layer comprising an n-type titanium dioxide film, the film having a thickness in the range of about 100 to about 1000 nanometers, the metal-oxide layer being disposed on the second side of the p-n junction layer;
   a top electrical layer disposed on the metal-oxide layer; and
   a contact layer disposed on the back side of the backing layer.

4. The solar cell of claim 3, wherein the metal-oxide layer comprises a dye for absorbing incident photons and converting the photons into electrons.

5. The solar cell of claim 3, wherein the metal-oxide layer is comprised of an n-type single-phase anatase titanium dioxide film.

6. The solar cell of claim 3, wherein the top electrical layer comprises a pattern that is one of: a grid pattern and an interdigital pattern.

7. The solar cell of claim 3, wherein the top electrical layer and the contact layer are comprised of platinum.

8. The solar cell of claim 3, wherein the backing layer comprises silicon.

* * * * *